United States Patent [19]
Turner et al.

[11] Patent Number: 5,594,356
[45] Date of Patent: Jan. 14, 1997

[54] INTERCONNECTION DEVICE FOR CONNECTING TEST EQUIPMENT WITH A CIRCUIT BOARD DESIGNED FOR FINE PITCH SOLDER LEAD INTEGRATED CIRCUIT COMPONENTS

[75] Inventors: Leonard Turner, Beaverton; Mark Trobough, Aloha; Ashok Kabadi, Beaverton; Ron Flamm, Newberg, all of Oreg.

[73] Assignee: Intel Corporation, Santa Clara, Calif.

[21] Appl. No.: 382,295

[22] Filed: Feb. 1, 1995

Related U.S. Application Data

[62] Division of Ser. No. 343,842, Nov. 23, 1994, Pat. No. 5,418,469, which is a continuation of Ser. No. 79,242, Jun. 17, 1993, abandoned.

[51] Int. Cl.$^6$ .................................................... G01R 31/02
[52] U.S. Cl. ............................................ 324/755; 439/68
[58] Field of Search .................................... 324/755, 761, 324/762, 754; 439/71, 68, 912

[56] References Cited

U.S. PATENT DOCUMENTS

| | | | |
|---|---|---|---|
| 2,578,288 | 12/1951 | Cook | 200/51 R |
| 4,506,938 | 3/1985 | Madden | 439/71 |
| 5,156,649 | 10/1992 | Compton et al. | 439/68 |
| 5,202,622 | 4/1993 | Cole et al. | 324/761 |
| 5,247,246 | 9/1993 | Van Loan et al. | 324/761 |

Primary Examiner—Ernest F. Karlsen
Assistant Examiner—Russell M. Kobert
Attorney, Agent, or Firm—Blakely, Sokoloff, Taylor & Zafman

[57] ABSTRACT

An apparatus and method for reliably interconnecting a test device with a circuit board designed for fine pitch solder lead surface mounted components is described. The test equipment interface system of the present invention comprises a board interconnect unit, an interposer, and a test device cable. The test device cable is coupled to a test device, which can receive and manipulate signals via the cable. These signals correspond to signals provided by a component being emulated by the present invention. A component being emulated is replaced on the circuit board by the board interconnect unit. The board interconnect unit has leads or pins in a quantity, size, and configuration corresponding to a component being emulated and is typically soldered to a circuit board under test for the purpose of analyzing and debugging the circuitry on the circuit board. The board interconnect unit comprises a lead frame which is attached to a metal body. The lead frame is used to route or convert the pins into an array of contact pads. The contact pads are relatively widely spaced for better access to and connection with an array of electrically conductive spring pins or contact pins of the interposer. Because the lead frame converts the fine dimension pins to a more widely spaced array of contact pads, the corresponding spring pins of the interposer do not have to be manufactured with the precise dimensional tolerances required for the manufacture of the pins.

8 Claims, 8 Drawing Sheets

INTERCONNECTION DEVICE FOR CONNECTING TEST EQUIPMENT WITH A CIRCUIT BOARD DESIGNED FOR FINE PITCH SOLDER LEAD INTEGRATED CIRCUIT COMPONENTS

This is a divisional of application Ser. No. 08/343,842, filed Nov. 23, 1994, now U.S. Pat. No. 5,418,469, which is a continuation of application Ser. No. 08/079,242, filed Jun. 17, 1993, now abandoned.

BACKGROUND OF THE INVENTION

1. Field of the Invention

The present invention relates to the field of testing circuit boards. Specifically, the present invention pertains to devices for connecting test equipment to circuit boards designed for fine pitch solder lead integrated circuits.

2. Description of Related Art

It is necessary to use test equipment to test prototypes of circuit board designs. Various forms of prior art test equipment provide connections between the test equipment and solder leads of components on the circuit board. Some test probes provide individual connection to a particular pin of a component on a circuit board. Oscilloscopes and some logic analyzers use this interconnection technique. Other prior art test probes include test clips that may be clipped onto integrated circuit components to form connections with multiple pins on the component. The test clip may then be connected in a variety of ways to the test equipment.

The rapid advance of integrated circuits and circuit board technology has lead to several problems in using these prior art test equipment interconnection devices. As integrated circuits and circuit board fabrication techniques have improved, substantially greater functionality has been incorporated into modern integrated circuits. As integrated circuits expand in functionality, a greater number of solder leads or pins are required to effectively communicate with these devices. As the number of pins increases, the size of the pins and spacing between the pins decreases thereby not unreasonably increasing the physical space required for the component on a circuit board. For example, fine pitch solder lead integrated circuit components being fabricated today generally include those components with lead centers no larger than 0.8 millimeters or 0.0315 inches apart. These fine pitch solder lead components make test equipment or test probe access very difficult. Moreover, the fine pitch solder leads are more delicate and more susceptible to damage by test probe connection. In combination with the diminishing size of component solder leads, circuit boards are being more densely populated with integrated circuit components. As circuit boards become more densely populated, test probe access again becomes more difficult. Further, components installed on a circuit board are increasingly required to be low profile (i.e., a minimum vertical dimension perpendicular to the plane of the circuit board) components. Low profile components allow a plurality of circuit boards to be more closely spaced in a particular computer system enclosure. Again however, low profile circuit boards decrease the space available for access by test equipment. Prior art test equipment interconnection devices have been unable to operate in an environment of decreased component and board dimensions.

Thus, a better test equipment interconnection device is needed.

SUMMARY OF THE INVENTION

The present invention is an apparatus and method providing reliable interconnection between a test device and a circuit board designed for fine pitch solder lead components.

The test equipment interface system of the present invention comprises a board interconnect unit, an interposer, and a test device cable. The test device cable is coupled to a test device, which can receive and manipulate signals via the cable. These signals correspond to signals provided by a component being emulated by the present invention. A component being emulated is replaced on the circuit board by the board interconnect unit. The board interconnect unit has leads or pins in a quantity, size, and configuration corresponding to a component being emulated. The board interconnect unit is typically soldered to a circuit board under test for the purpose of analyzing and debugging the circuitry on the circuit board. Because of the fine pitch dimension of the pins, prior art systems have been unable to provide an effective and reliable test device interconnection system.

The board interconnect unit comprises a lead frame which is attached to a metal body. The lead frame is used to route or convert the pins into an array of contact pads. The contact pads are relatively widely spaced for better access to and connection with an array of electrically conductive spring pins or contact pins of the interposer. Because the lead frame converts the fine dimension pins to a more widely spaced array of contact pads, the corresponding spring pins of the interposer do not have to be manufactured with the precise dimensional tolerances required for the manufacture of the pins.

Thus, board interconnect unit of the present invention is a circuit board test device interconnect apparatus comprising a body and a lead frame coupled to the body. The lead frame includes a plurality of fine pitch leads for electrically coupling the apparatus to a circuit board. The lead frame also includes an array of electrical contact pads integrally formed with the plurality of fine pitch leads, each contact pad of the array of contact pads being electrically connected with a corresponding one of the plurality of fine pitch leads, the array of electrical contact pads being more widely spaced than the plurality of fine pitch leads. The lead frame also includes alignment holes integrally fabricated with the plurality of fine pitch leads and the array of electrical contact pads.

It is therefore an advantage of the present invention that the interconnection device of the present invention converts the fine pitch solder leads of a surface mount component to an array of relatively widely spaced metal pads suitable for connection by a test probe. This allows the use of conventional pressure connect technology to connect the circuit board to a test device with a flexible cable. It is a further advantage of the present invention to provide a very compact interconnection device. This eliminates the need to design the circuit board with special considerations to accommodate the test probe. It is a further advantage of the present invention to provide a single path of conductive material between the bottom of the solder leads and the top of the metal pads. Because there is no intermediate connection, there is less risk of failure and less degradation of electrical performance between the circuit board and the test probe. It is a further advantage of the present invention that the design minimizes the chances for interconnection failure. The accuracy and precision with which the present invention may be fabricated is exceptional due to the design of the invention and the process used to fabricate it as described in the following detailed description.

These and other advantages of the present invention will become apparent as illustrated in the figures and described in the following detailed description of the preferred embodiment.

DETAILED DESCRIPTION OF THE PREFERRED EMBODIMENT

The present invention is an apparatus and method providing a reliable interconnection between a test device and a circuit board designed for fine pitch solder lead surface mounted components. In the following detailed description, numerous specific details are set forth in order to provide a thorough understanding of the present invention. However, it will be apparent to one of ordinary skill in the art that these specific details need not be used to practice the present invention. In other circumstances, well known structures, materials, circuits, and interfaces have not been shown or described in detail in order not to unnecessarily obscure the present invention.

Figure 1:
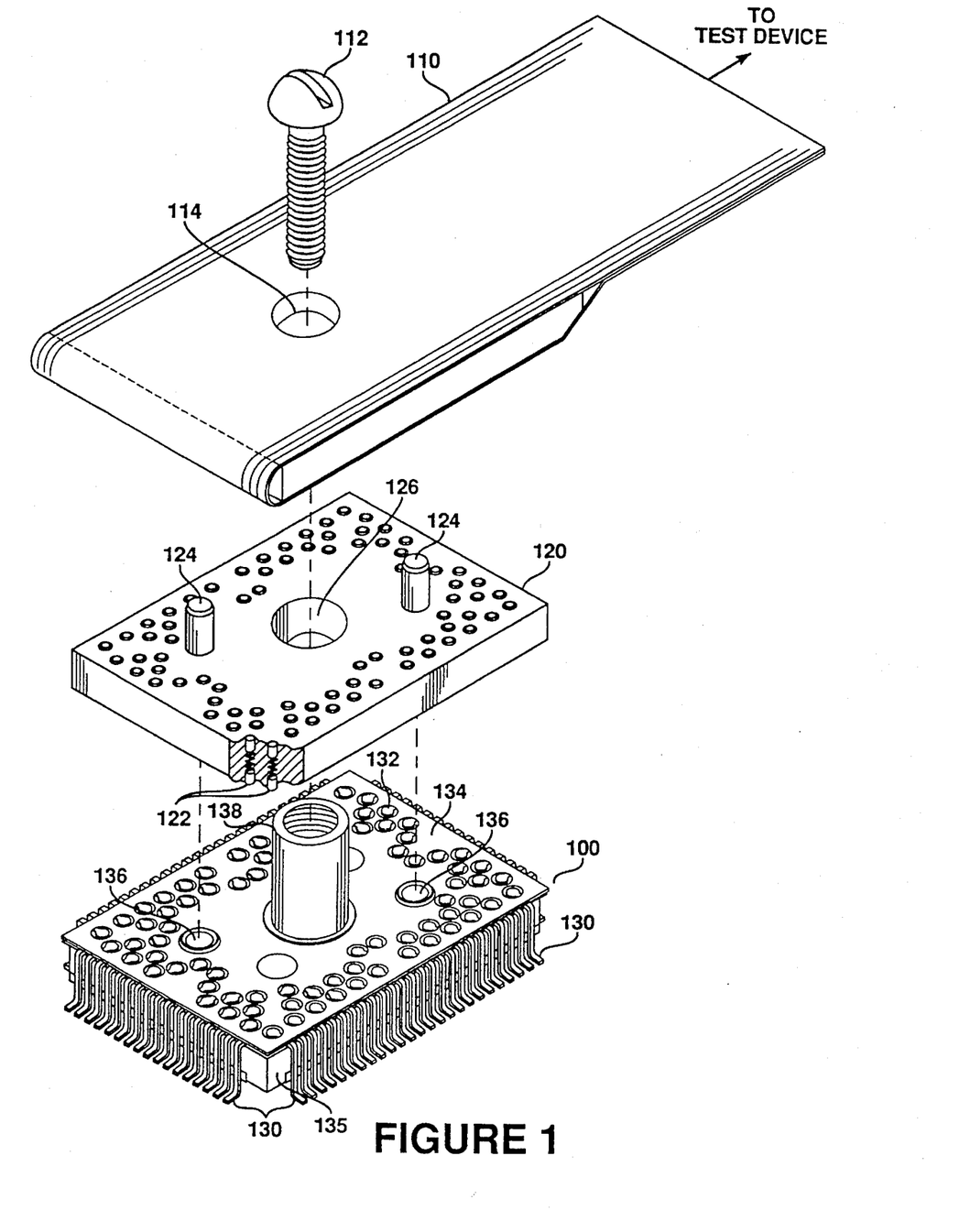
FIG. 1 illustrates the interconnection device of the present invention including the board interconnect unit, the spring pin interposer component, and the test equipment cable.

Referring now to FIG. 1, the test equipment interface system of the present invention is illustrated. The present invention comprises a board interconnect unit 100, an interposer 120 and a test device cable 110. Test device cable 110 is coupled to a test device (not shown) which can receive and manipulate signals via cable 110. These signals correspond to signals provided by a component being emulated by the present invention. A component being emulated is replaced on the circuit board by the board interconnect unit 100. Board interconnect unit 100 has leads or pins in a quantity, size, and configuration corresponding to a component being emulated. The board interconnect unit 100 is typically soldered to a circuit board under test for the purpose of analyzing and debugging the circuitry on the circuit board. Because of the fine pitch dimension of pins 130, prior art systems have been unable to provide an effective and reliable test device interconnection system. The fabrication of board interconnect unit 100 is therefore critical to the operation of the present invention.

Board interconnect unit 100 comprises a lead frame 134 which is attached to a metal body 135. Lead frame 134 is used to route or convert pins 130 into an array of contact pads 132. Contact pads 132 may be relatively widely spaced for better access to and connection with an array of electrically conductive spring pins or contact pins 122 of interposer 120. The fabrication of spring pins for electrical contact with a contact pad is well known to those of ordinary skill in the art. Because lead frame 134 converts the fine dimension pins 130 to a more widely spaced array of contact pads 132, the corresponding spring pins 122 of interposer 120 do not have to be manufactured with the precise dimensional tolerances required for the manufacture of pins 130. The fabrication of board interconnect unit 100 and its component lead frame 134 is described in detail in the following sections in relation to FIGS. 2A, 2B, and 3–8.

Figure 2A:
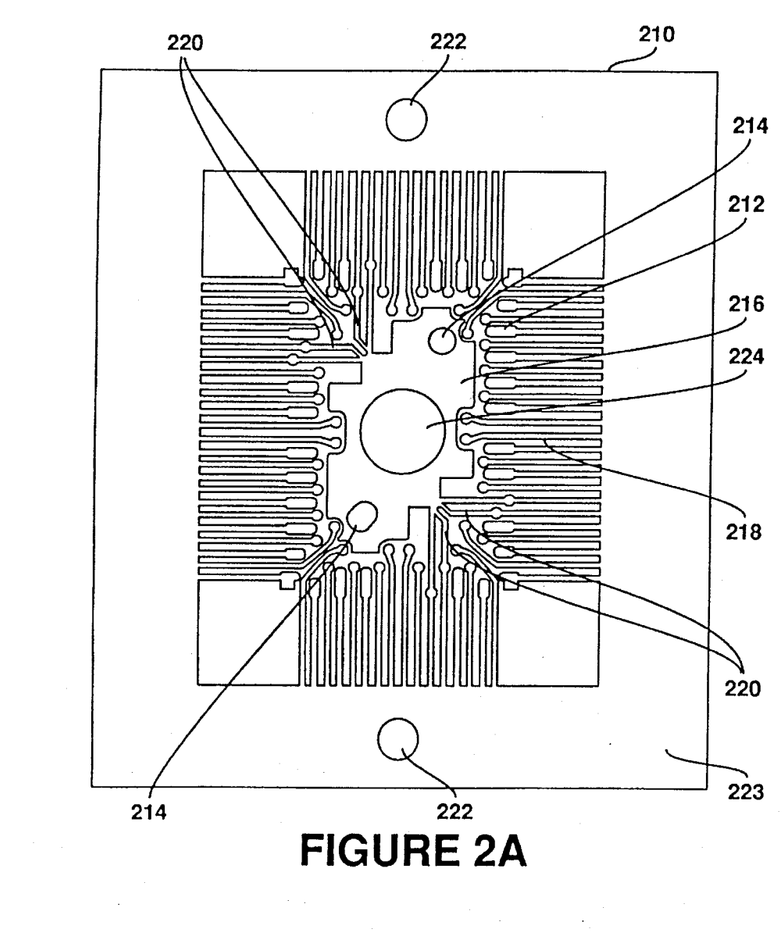
FIGS. 2A and 2B illustrate a lead frame with leads that correspond to the geometry of the board interconnect leads and contact pads that correspond to the geometry of the spring pin interposer and the test equipment cable.
Figure 2B:
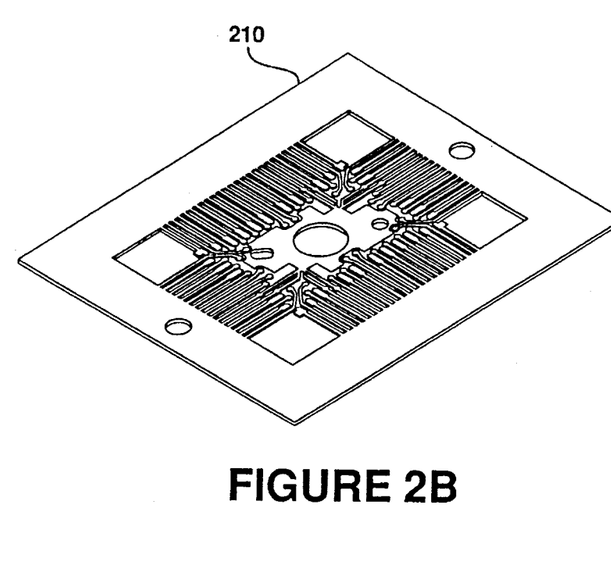

Referring now to FIGS. 2A and 2B, the first phase of the lead frame fabrication process is illustrated. Lead frame 134 is fabricated out of Beryllium-copper sheet or other suitable material using photolithography and chemical etching processes, collectively known as chemical milling. The etch pattern for the lead frame 210 is initially created as a photolithographic film that defines the individual leads or pins 218, their associated contact pads 212, process tooling holes 222, an outside supporting frame 223 to protect and hold leads 218 in place, and a central plane 216 that contains the alignment holes 214 used for aligning interposer 120 to board interconnect unit 100. Using a chemical milling process, well known in the art, the dimensions of pins 218 and separation between same can be fabricated in a fine pitch dimension that corresponds to the fine pitch solder leads of a component being emulated. In the preferred embodiment, the fine pitch solder lead components being emulated are generally considered to be those components with lead centers no larger than 0.8 millimeters (0.0315 inches). Lead frame 210 also includes temporary tie bars 220 as illustrated in FIG. 2A. Tie bars 220 are used to connect central plane 216 with the remaining portions of lead frame 210 prior to the laminating step. Tie bars 220 allow the incorporation of alignment holes 214 into the same photolithographic film as the other lead frame 210 features, specifically contact pads 212 and leads 218. As a result, the exact spatial relationship between each feature in lead frame 210 (with respect to the alignment holes 214) is tightly controlled for accuracy and precision by the photolithography process. Thus, the chance of misalignment with interposer 120 is substantially reduced. After lead frame 210 is laminated, the spatial relationship of the features of lead frame 210 is fixed and tie bars 220 can be removed. Tie bars 220 are removed by punching a hole through lead frame 210 in the location of tie bars 220. Lead frame 210 also includes a hole 224 through which a threaded standoff 138 is inserted. Standoff 138 is used to couple the board interconnect unit 100 with interposer 120 and test device cable 110. FIG. 2B illustrates lead frame 210 in a perspective view.

Figure 3:
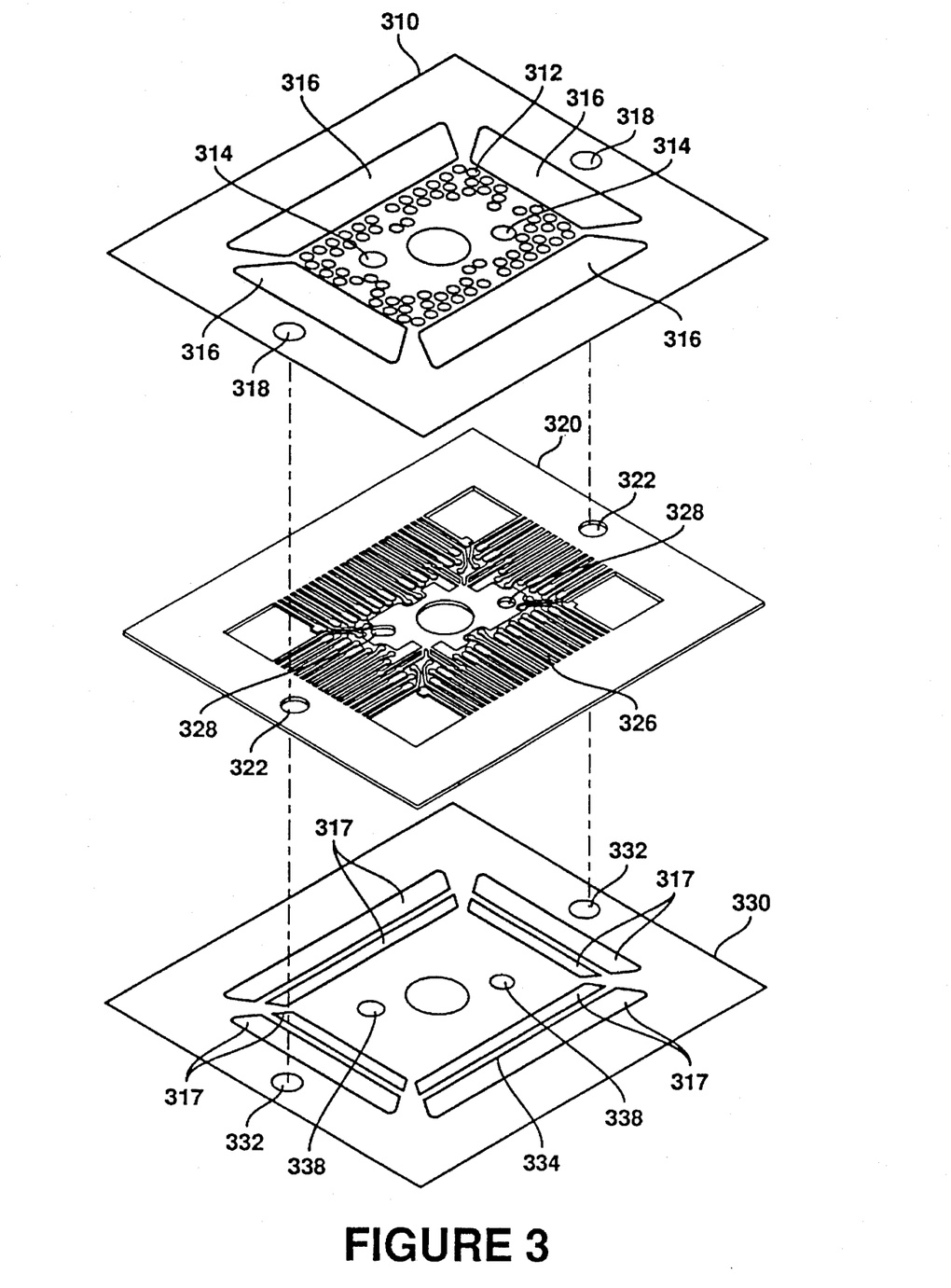
FIG. 3 illustrates the assembly of the topside laminate with the lead frame and the bottomside laminate.

Referring now to FIG. 3, the application of a laminate to lead frame 320 is illustrated. A topside laminate 310 is applied to the top of lead frame 320. A bottom side laminate 330 is applied to the bottom of lead frame 320. Both laminates 310 and 330 are sheets of polyimide film to which an adhesive compound is applied. The adhesive compound cures under heat and pressure. The use of polyimide film and associated adhesive agents is well known to those of ordinary skill in the art. Laminates 310 and 330 protect the fragile leads of lead frame 320, stabilize the leads, and lock into place the spatial relationship of the leads and the contact pads of lead frame 320 with alignment holes 328 of lead frame 320, alignment holes 314 of topside laminate 310, and alignment holes 338 of bottomside laminate 330. In addition, laminates 310 and 330 electrically insulate the leads 326 from one another and from the metal body 135 of board interconnect unit 100, which is connected to lead frame 210 in a later fabrication process step. The top laminate 310 is cut in a pattern of holes 312 which correspond to the pattern of contact pads 132 as illustrated in FIG. 1. The bottom laminate 330 is cut in a pattern to create special stabilizer strips 334 which bond to the leads 326 to provide additional stability during and after the steps of forming lead frame 320. Top laminate 310 includes process tooling holes 318 which are used to align top laminate 310 with process tooling holes 322 of lead frame 320 and process tooling holes 332 of bottom laminate 330. In this manner, lead frame 320 is aligned and laminated with top laminate 310 and bottom laminate 330. Once the laminates have been applied, lead frame 210 is more robust and easier to handle in subsequent steps of the manufacturing process of the preferred embodiment. The cutaway patterns 316 of top laminate 310 and the cutaway patterns 317 of bottom laminate 330 expose regions of lead frame 320. These exposed regions of lead frame 320 are electroplated with gold over nickel or an equivalent solderable metal using standard electroplating techniques which are well known to those of ordinary skill in the art.

Figure 4:
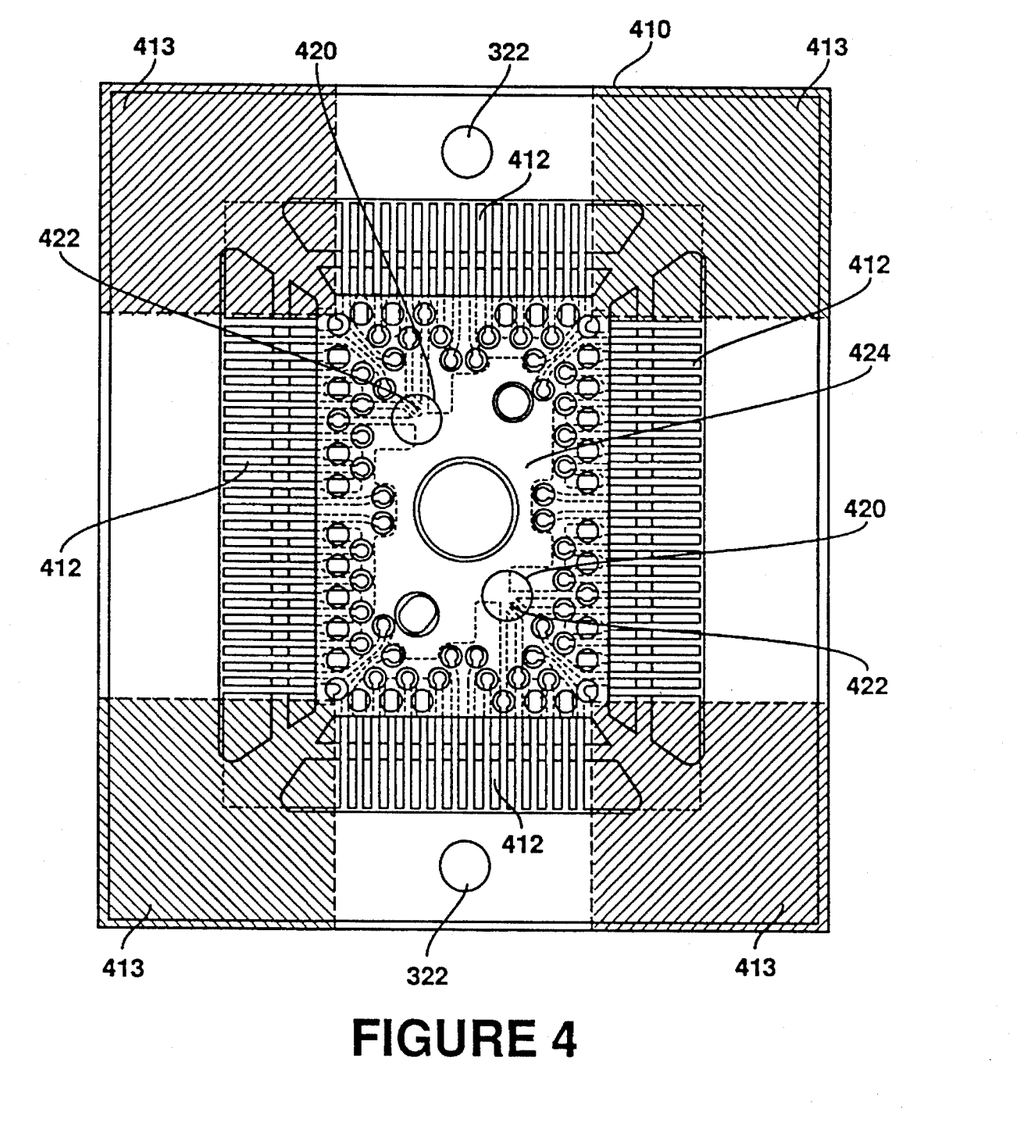
FIG. 4 illustrates the completed assembly of the laminated lead frame.
Figure 5:
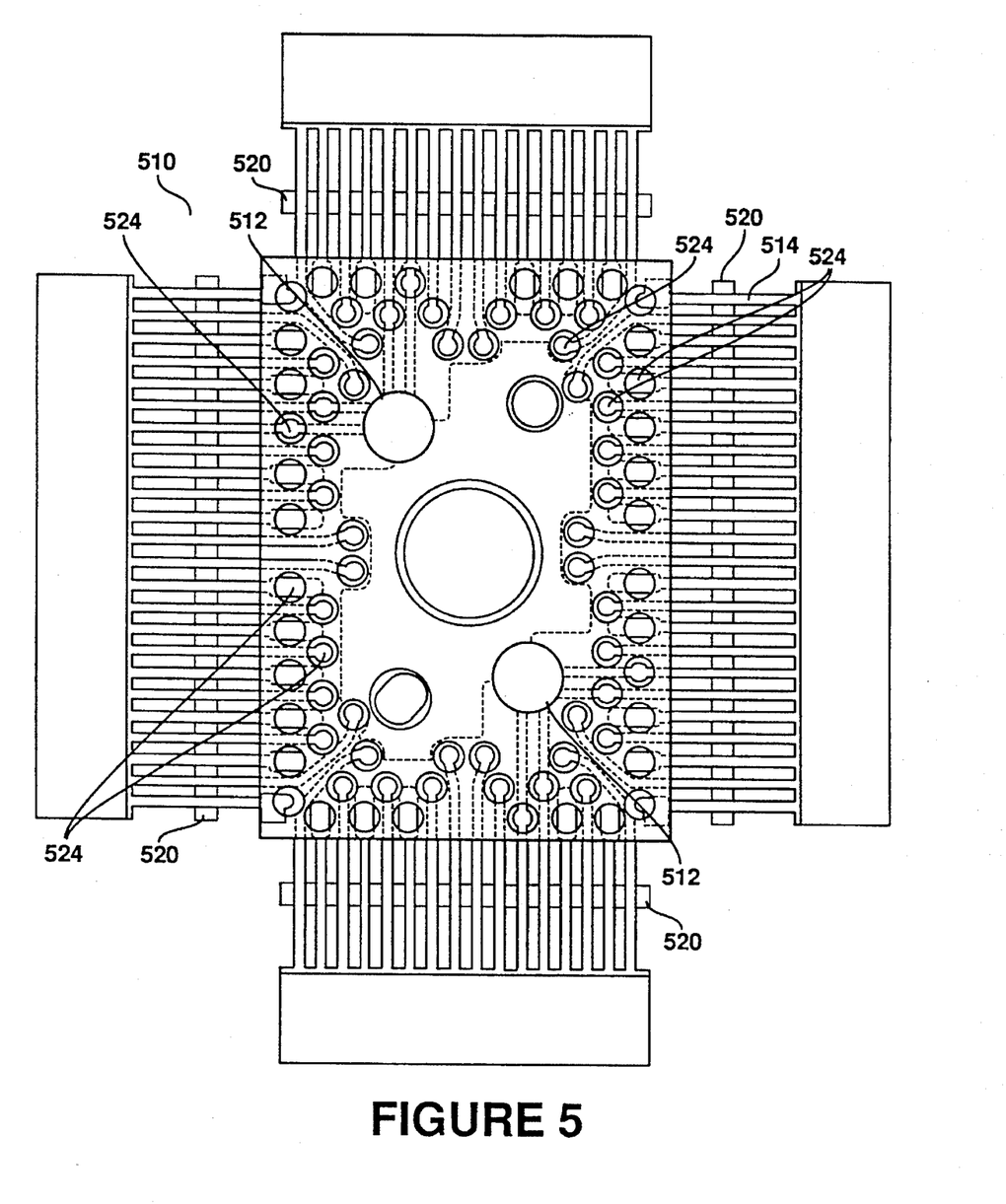
FIG. 5 illustrates the lead frame after electroplating and after the corners of the outside supporting frame are cut away.

Referring now to FIG. 4, lead frame 410 is shown after being laminated and electroplated as described above. After electroplating, the outside corners 413 of lead frame 410 are cut away using standard die cutting technology. The resulting lead frame 510 is illustrated in FIG. 5. By cutting out the corners 413 of lead frame 410, the leads 412 can be formed downward on all four sides in a later process step. By forming leads 412 downward, leads 412 can be configured to conform to the geometry of leads of an integrated circuit which the board interconnect unit 100 is designed to replace for testing purposes. After cutting out the corners 413 of lead frame 410, holes 420 are punched through lead frame 410 thereby cutting temporary tie bars 422 which previously supported the central plane 424 of lead frame 410. By cutting temporary tie bars 422, the central plane 424 becomes electrically isolated from leads 412. The holes 512 cutting the temporary tie bars 422 are illustrated in FIG. 5.

Referring now to FIG. 5, the lead frame 510 is shown after the outside supporting frame corners 413 are cut away and after holes 512 are punched through lead frame 510 to sever the temporary tie bars. As shown in FIG. 5, lead frame 510 still has stabilizer strips 520 attached to leads 514 to reinforce and stabilize the delicate leads. Also evident in FIG. 5 is the continuous conductive path created in lead frame 510 between individual leads 514 and their corresponding individual contact pads 524. Thus, the present invention provides a single path of conductive material between the bottom of solder leads 514 (i.e., the end soldered to the circuit board) and the top of conductive pads 524. Because there is no intermediate connection between leads 514 and pads 524, there is less risk of failure and less degradation of electrical performance between the circuit board and the test probe to which a test device is connected.

Figure 6A:
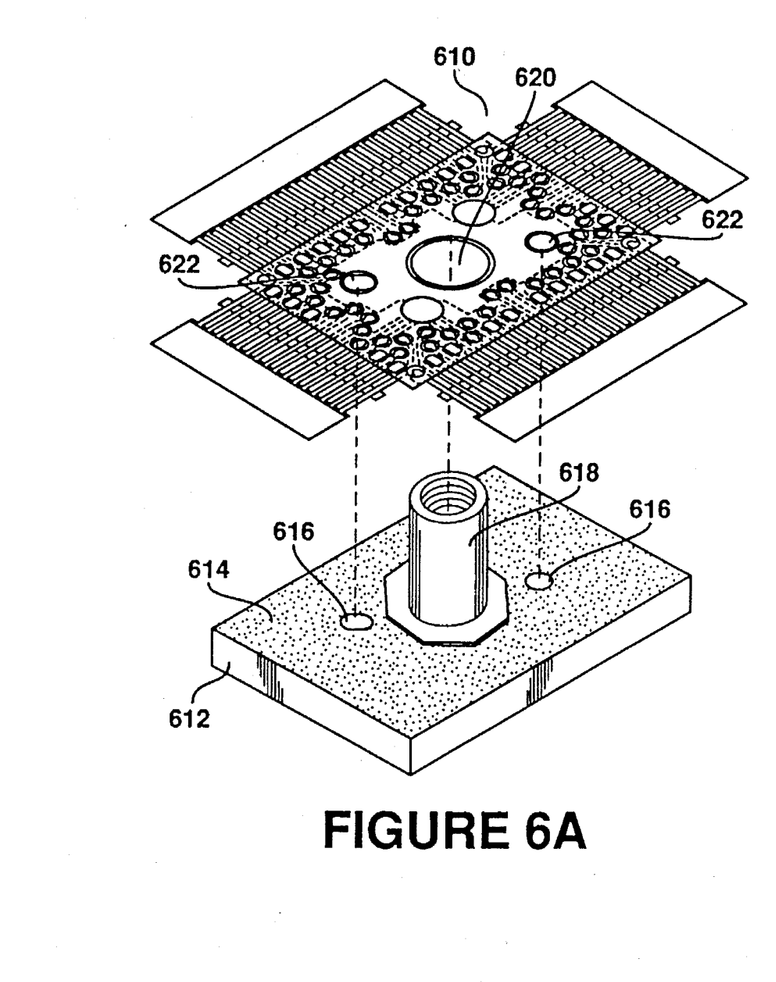
FIGS. 6A and 6B illustrate the alignment and attachment of the laminated lead frame assembly to a metal body, which provides stiffness and means for attaching the interposer and the test equipment cable.
Figure 6B:
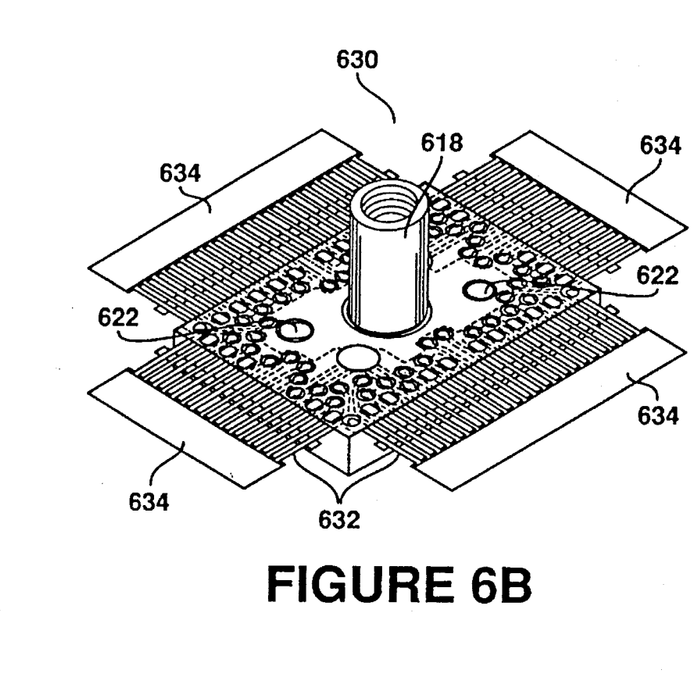
Figure 7:
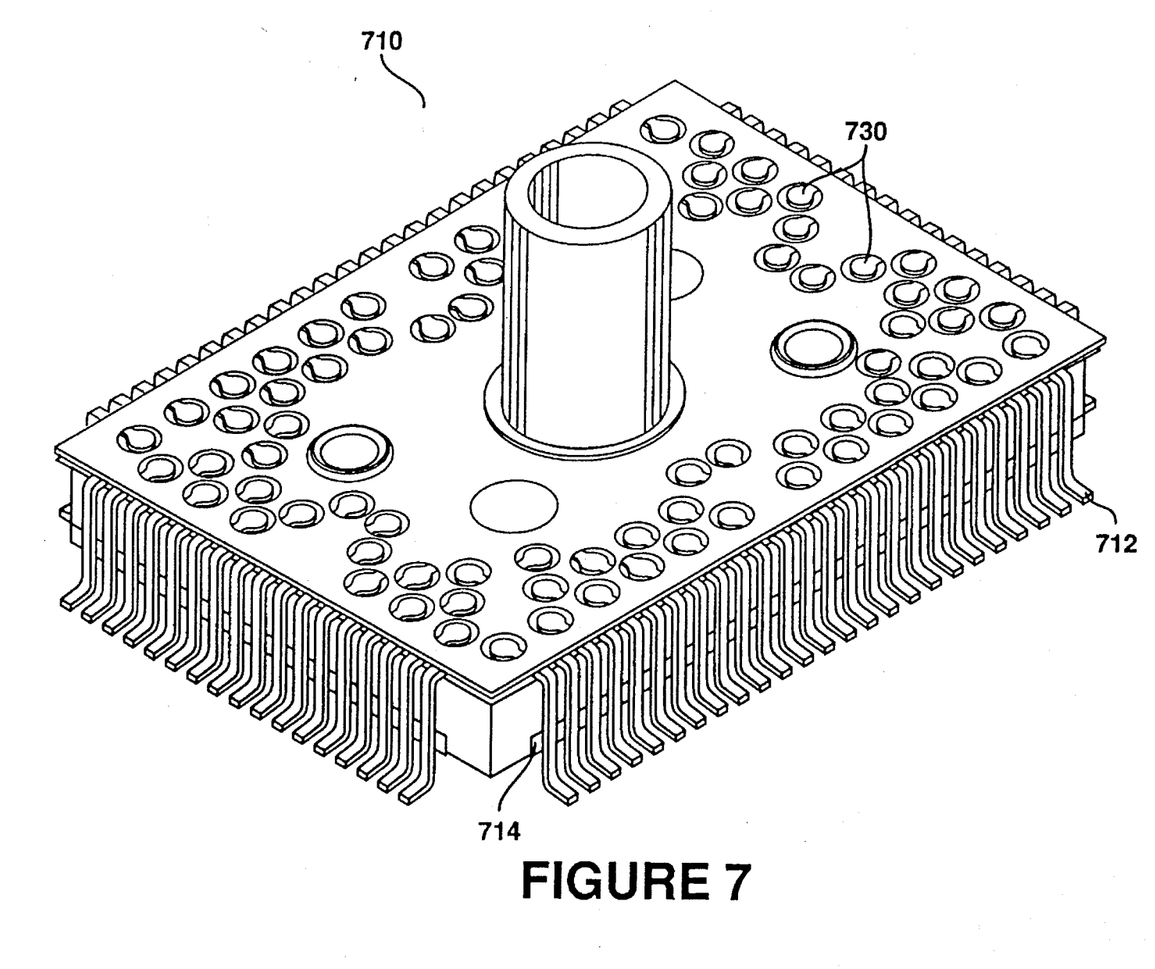
FIG. 7 illustrates a completely assembled board interconnect unit of the interconnection device of the present invention with its leads trimmed, formed, and ready for installation on a circuit board.

Referring now to FIGS. 6A and 6B, the lead frame 610 is shown in FIG. 6A as lead frame 610 is being attached to metal body 612 to form the board interconnect unit 630 illustrated in FIG. 6B. It will be apparent to one of ordinary skill in the art that metal body 612 may be fabricated from a material other than metal. For example, body 612 may be fabricated from a hard plastic or composite material. Lead frame 610 is aligned with metal body 612 with alignment holes 622 of lead frame 610 and alignment holes 616 of metal body 612. Lead frame 610 is also aligned using hole 620 as aligned with threaded standoff 618 of metal body 612. Once aligned, lead frame 610 is attached to metal body 612 using a well known pressure activated adhesive 614 in the preferred embodiment of the present invention. In an alternative embodiment, lead frame 610 may be attached to metal body 612 using other mechanical or chemical adhesive means. Once the lead frame 610 is attached to metal body 612, the resulting combination is the board interconnect unit 630 illustrated in FIG. 6B. In the final stage of fabrication, the remaining portions of outside supporting frame 634 are cut off from the ends of leads 632. Leads 632 are then formed downward into a gull wing shape, similar to a shape of the pins of an actual surface mount component which is emulated by board interconnect unit 630. The completed board interconnect unit 710 is illustrated in FIG. 7. As shown in FIG. 7, board interconnect unit 710 still has stabilizer strips 714 supporting and stabilizing leads 712. Leads 712, now in a gull wing shape and suitable for soldering to a circuit board being tested, are also shown in FIG. 7. The contact pads 730 corresponding to leads 712 are also shown in FIG. 7. Thus, the fabrication of board interconnect unit 710 having fine pitch solder leads 712 is illustrated.

Referring again to FIG. 1, a board interconnect unit 100 fabricated in the manner described above is illustrated. The board interconnect unit 100 may now be permanently attached (usually surface mount soldered) to a circuit board under test using the same techniques as with an actual integrated circuit component which the board interconnect unit and associated test device will emulate. The board interconnect unit 100 is soldered to a site on a target circuit board where the actual surface mount integrated circuit component would normally be soldered. As shown in FIG. 1, the top side of board interconnect unit 100 consists of an array of contact pads 132 which serve as interconnection points from board interconnect unit 100 to test device cable 110 through interposer 120. As shown in FIG. 1, interposer 120 comprises an array of electrically conductive spring pins 122 which are arranged in a manner corresponding to the array of conductive pads 132 of board interconnect unit 100. Alignment pins 124 of interposer 120 are also provided in a position corresponding to alignment holes 136 of board interconnect unit 100. In order to connect a test device to a circuit board under test using the present invention, interposer 120 is aligned with board interconnect unit 100 using alignment posts 124 and alignment holes 136. In addition, hole 126 of interposer 120 provides clearance for threaded standoff 138. As interposer 120 is brought into contact with board interconnect unit 100, spring pins 122 make electrical contact with corresponding contact pads 132 on board interconnect unit 100. In a similar manner, test device cable 110 is coupled to interposer 120 using alignment pins 124 on interposer 120 which are aligned with alignment holes (not shown) on the under side of test device cable 110. The under side of test device cable 110 includes an array of contact pads (not shown) in an arrangement corresponding to the arrangement of spring pins 122 on the upper side of interposer 120. Test device cable 110, interposer 120, and board interconnect unit 100 are connected together in this manner using a screw 112 which is inserted into threaded standoff 138 through hole 114 and hole 126. As test device cable 110, interposer 120, and board interconnect unit 100 are all connected in this manner, leads 130 are electrically coupled through contact pads 132 and spring pins 122 with corresponding lines within test device cable 110.

Figure 8:
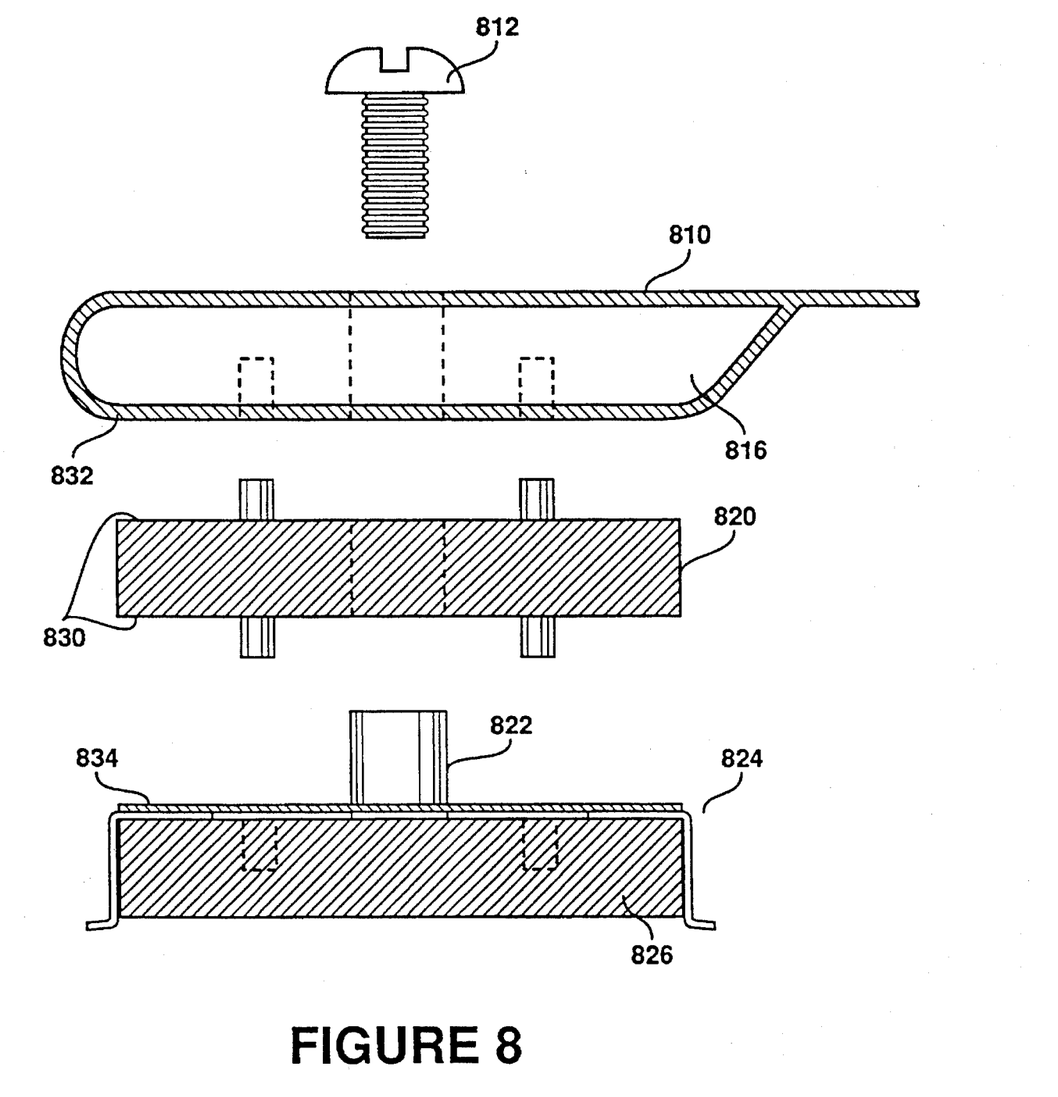
FIG. 8 illustrates a side view of the present invention.

Referring to FIG. 8, a side view of the present invention is illustrated. Screw 812 and standoff 822 provide a clamping force for clamping interposer 820 between cable 810 and board interconnect unit 824. Stiffeners 816 and 826 spread the clamping force out into a zone that includes all of the spring pins 830 on interposer 820. In this way, a sufficient force is provided on every spring pin 830 to assure reliable electrical contact between the contact pads 832 on cable 810 and contact pads 834 on board interconnect unit 824.

In this manner, a test device is electrically coupled with corresponding leads on board interconnect unit 100. Thus, the present invention provides an extremely reliable electrically passive conductive path from a circuit board under test to a cable 110 which is connected to a test device. As evident in FIG. 1, the board interconnect unit 100 of the present invention has a very compact configuration. Furthermore, board interconnect unit 100 occupies no more space on a circuit board than the surface mount component being emulated. That is, board interconnect unit 100 occupies the same footprint or area on the circuit board as the component being emulated. This aspect of the present invention eliminates the need to design a circuit board with special considerations to accommodate a test probe. Additionally, the present invention, including cable 110, interposer 120, and board interconnect unit 100 has a relatively low height profile making this interconnection apparatus useful in many applications where prior art devices would not fit.

Thus, an apparatus and method for reliably interconnecting a test device with a circuit board designed for fine pitch solder lead surface mounted components is described. Although the present invention is described herein with reference to a specific preferred embodiment, many modifications and variations therein will readily occur to those of ordinary skill in the art. Accordingly, all such variations and modifications are included within the intended scope of the present invention as defined by the following claims.

We claim:

1. A circuit board test device interconnect apparatus comprising:

a body; and a lead frame coupled to said body, said lead frame including,
   i. a plurality of fine pitch leads for electrically coupling said apparatus to a circuit board;
   ii. an array of electrical contact pads integrally formed with said plurality of fine pitch leads, each contact pad of said array of contact pads being electrically connected with a corresponding one of said plurality of fine pitch leads, said array of electrical contact pads being more widely spaced than said plurality of fine pitch leads; and
   iii. alignment holes integrally fabricated with said plurality of fine pitch leads and said array of electrical contact pads.

2. The apparatus as claimed in claim 1 wherein said lead frame is protectively laminated on an upper and a lower surface.

3. The apparatus as claimed in claim 1 wherein said lead frame is initially fabricated with tie bars electrically coupling said plurality of fine pitch leads to a central plane of said lead frame, said tie bars being absent in a finished lead frame.

4. The apparatus as claimed in claim 1 wherein said lead frame further includes stabilizer strips non-electrically connecting said plurality of fine pitch leads.

5. The apparatus as claimed in claim 1 wherein said lead frame is fabricated using a photolithography and chemical etching process.

6. The apparatus as claimed in claim 1 wherein said body includes a standoff, said lead frame further including a hole through which said standoff is inserted.

7. The apparatus as claimed in claim 1, further comprising: tie bars electrically coupling the plurality of fine pitch leads to a central plane of the lead frame.

8. The apparatus of claim 7, wherein a central plane is aligned with the lead frame by tie bars, the apparatus having no tie bars.

\* \* \* \* \*